United States Patent

Jimarez et al.

(10) Patent No.: US 7,718,902 B2
(45) Date of Patent: May 18, 2010

(54) Z INTERCONNECT STRUCTURE AND METHOD

(75) Inventors: Lisa J. Jimarez, Newark Valley, NY (US); Mark V. Pierson, Binghamton, NY (US)

(73) Assignee: International Business Machines Corporation, Armonk, NY (US)

( * ) Notice: Subject to any disclaimer, the term of this patent is extended or adjusted under 35 U.S.C. 154(b) by 1049 days.

(21) Appl. No.: 10/937,654

(22) Filed: Sep. 9, 2004

(65) Prior Publication Data

US 2005/0051608 A1  Mar. 10, 2005

Related U.S. Application Data

(62) Division of application No. 10/041,261, filed on Jan. 8, 2002, now Pat. No. 6,805,280.

(51) Int. Cl.
*H05K 1/03* (2006.01)
(52) U.S. Cl. .......................... 174/255; 361/773
(58) Field of Classification Search ................ 174/255, 174/259; 361/773–774
See application file for complete search history.

(56) References Cited

U.S. PATENT DOCUMENTS

| | | | |
|---|---|---|---|
| 3,527,625 A * | 9/1970 | Mollring et al. ............... 148/24 |
| 3,795,047 A * | 3/1974 | Abolafia et al. ............... 29/843 |
| 4,081,601 A * | 3/1978 | Dinella et al. ............... 174/257 |
| 5,039,552 A * | 8/1991 | Riemer ...................... 427/98.4 |
| 5,346,558 A * | 9/1994 | Mathias ...................... 148/23 |
| 5,404,044 A | 4/1995 | Booth et al. |
| 5,601,678 A * | 2/1997 | Gerber et al. ............... 156/150 |
| 5,637,834 A | 6/1997 | La Bate, Jr. et al. |
| 5,761,048 A | 6/1998 | Trabucco |
| 6,002,177 A | 12/1999 | Gaynes et al. |
| 6,037,657 A | 3/2000 | Tsurumi et al. |
| 6,159,586 A | 12/2000 | Inoue et al. |
| 6,163,957 A | 12/2000 | Jiang et al. |
| 6,326,555 B1 | 12/2001 | McCormack et al. |
| 6,465,084 B1 | 10/2002 | Curcio et al. |

* cited by examiner

*Primary Examiner*—Jeremy C Norris
(74) *Attorney, Agent, or Firm*—Wenjie Li; Hoffman Warnick LLC

(57) ABSTRACT

The current invention provides a method of attaching a plurality of cores wherein a core has a via with a conductive surface to be electrically connected to a conductive surface on another core. The method provides for applying a metallurgical paste to a conductive surface, removing a portion of the flux from the paste and joining the two cores. The current invention also provides a structure including a plurality of cores wherein a metallurgical paste electrically connects a via with a conductive surface on a core to a conductive surface on another core.

20 Claims, 2 Drawing Sheets

Z INTERCONNECT STRUCTURE AND METHOD

REFERENCE TO PRIOR APPLICATION

This application is a divisional of U.S. patent application Ser. No. 10/041,261, filed on Jan. 8, 2002, which is hereby incorporated herein by reference, now U.S. Pat. No. 6,805,280.

BACKGROUND OF THE INVENTION

1. Technical Field

The present invention relates to circuit board processing and attaching cores. Specifically, the present invention provides a method and structure wherein cores are attached and an electrical connection is made between conductive surfaces on the cores using a metallurgical paste.

2. Background Art

A common procedure in circuit board processing involves laminating multiple cores together. However, generally, the cores are not electrically connected via to via during lamination. For example, one method involves first electrically connecting the cores using conductive pads. After lamination, a hole is drilled through the conductive pads and electroplated with copper to form the via.

An alternative solution uses conductive adhesive to electrically attach vias during lamination. The conductive adhesive is placed onto a via and electrically connects the vias when the cores are laminated together. However, conductive adhesives contain plate-like structures greater than 0.5 mils in size. These plates tend to clog at the top of the holes. Therefore, the adhesives cannot be used effectively with thicker cores and smaller vias. Additionally, conductive adhesives require precious metal for good connections, making the products more expensive. Finally, a substantial number of manufacturing sites are not equipped to handle conductive adhesives. Consequently, significant costs may be required to modify current manufacturing sites to use conductive adhesives.

As a result, there exists a need for a structure and method of attaching cores having vias with conductive surfaces using a conductive material having smaller particle sizes than what is currently used.

SUMMARY OF THE INVENTION

The invention provides a method and structure of attaching a plurality of cores.

A first aspect of the invention is directed to a method of attaching a first core to a second core, wherein the first core includes a via having a first conductive surface and wherein the second core includes a second conductive surface, the method comprising the steps of: applying a metallurgical paste onto the first conductive surface, the metallurgical paste including flux; removing a portion of the flux from the metallurgical paste; providing an adhesive sheet having an opening that substantially conforms to the first conductive surface and the second conductive surface; interposing the adhesive sheet between the first core and the second core such that the metallurgical paste on the first conductive surface aligns and contacts the second conductive surface; and joining the first core and the second core.

A second aspect of the invention is directed to a method of attaching a first core to a second core, wherein the first core includes a pad having a first conductive surface and wherein the second core includes a via having a second conductive surface, the method comprising the steps of: applying a metallurgical paste onto the first conductive surface, the metallurgical paste including flux; removing a portion of the flux from the metallurgical paste; providing an adhesive sheet having an opening that substantially conforms to the first conductive surface and the second conductive surface; interposing the adhesive sheet between the first core and the second core such that the metallurgical paste on the first conductive surface aligns and contacts the second conductive surface; and joining the first core and the second core.

A third aspect of the invention is directed to a structure comprising: a plurality of cores attached with an adhesive; wherein at least one core has a via having a first conductive surface; and wherein a metallurgical paste forms an electrical connection between the first conductive surface and a second conductive surface of another core.

The exemplary aspects of the present invention are designed to solve the problems herein described and other problems not discussed, which are discoverable by a skilled artisan.

BRIEF DESCRIPTION OF THE DRAWINGS

These and other features and advantages of this invention will be more readily understood from the following detailed description of the various aspects of the invention taken in conjunction with the accompanying drawings in which.

Figure 1:
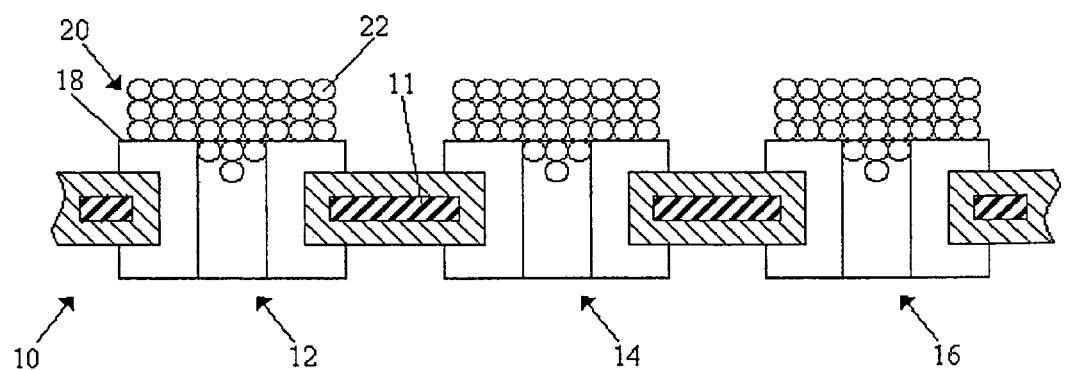
FIG. 1 shows a metallurgical paste screened onto a core having vias with conductive surfaces according to one embodiment of the current invention.

It is noted that the drawings of the invention are not to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements between the drawings.

DETAILED DESCRIPTION OF THE INVENTION

In the invention, a method and structure are provided for electrically joining a plurality of cores (or similar structures).

Referring now to FIG. 1, a core 10 is shown having a plurality of vias 12, 14, 16. Core 10 may comprise an epoxy core or any similar structure as commonly known in the art. Core 10 may include one or more planes 11, which may include, for example, a power plane or ground plane. Using via 12 as an example, each via has a conductive surface 18 formed on a surface of core 10. Conductive surface 18 can comprise a thin layer of any solderable conductive material including, for example, a precious metal or copper.

In the first step of the method, a metallurgical paste 20 is applied to conductive surface 18 using any standard screening technique or equivalent thereof now known or later developed. As shown in FIG. 1, some of metallurgical paste 20 may go below conductive surface 18 and partially or entirely fill via 12. Metallurgical paste 20 includes a plurality of metallurgical spheres 22 and flux. Metallurgical spheres 22 may comprise, for example, solder spheres.

After applying metallurgical paste 20 to conductive surface 18, a portion of the flux is removed from metallurgical paste 20. In one embodiment, metallurgical paste 20 is heated, causing some of the flux to evaporate. For example, metallurgical paste 20 may comprise eutectic solder paste, having a melting point of about 183 degrees C. After applying eutectic solder paste to core 10, core 10 may be placed in an oven at 160-170 degrees C. to remove a portion of the flux. In one embodiment, the temperature of the oven should not cause reflow of metallurgical paste 20. As shown in FIG. 1, a solid cylindrical sphere having numerous metallurgical spheres 22 remains on conductive surface 18 after metallurgical paste 20 is dried. Although solid, metallurgical spheres 22 remain more flexible than if allowed to reflow.

Figure 2:
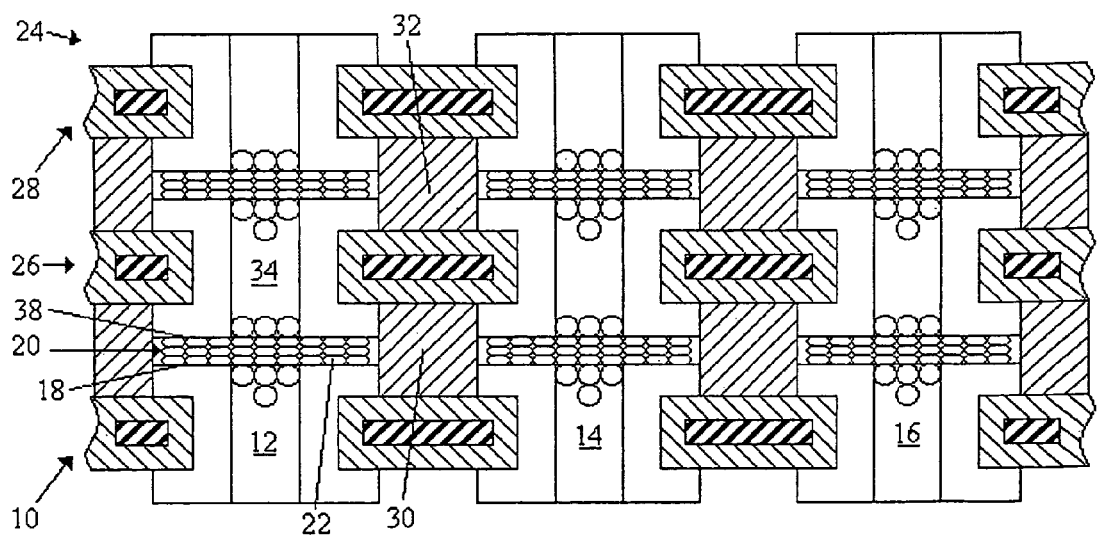
FIG. 2 shows a plurality of cores attached according to one embodiment of the current invention wherein a metallurgical paste makes an electrical connection between two vias with conductive surfaces.

Next, a plurality of cores are attached. Referring now to FIG. 2, a lay-up 24 is shown having multiple cores 10, 26, 28 that have been joined. In the shown embodiment, the structure includes cores 10, 26, 28 attached using adhesive sheets 30, 32. Adhesive sheets 30, 32 are interposed between cores 10, 26, 28 after having been prepared with the necessary opening (s) that substantially conform with, for example, vias 12, 14, 16 and their corresponding conductive surfaces 18. Adhesive sheets 30, 32 may be made from a nonconductive material, and are commonly known in the art. Because of the flexibility of the cylindrical sphere of dried metallurgical paste 20, adhesive sheets 30, 32 can be easily aligned with the surface features of cores 10, 26, 28.

Using cores 10, 26 and vias 12, 34 as an example of the general method and structure shown in FIG. 2, adhesive sheet 30 is interposed between cores 10, 26 such that an opening aligns with vias 12, 34. Cores 10, 26 are aligned so that vias 12, 34 align and metallurgical paste 20 on conductive surface 18 aligns and contacts conductive surface 38.

Finally, cores 10, 26, 28 are attached. Continuing with the example above, cores 10, 26 may be joined by compressing core 10 to core 26. Additionally, adhesive sheet 30 may require heating to bond with cores 10, 26. Therefore, cores 10, 26 may be simultaneously compressed and heated to a temperature required to cause adhesive sheet 30 to bond with cores 10, 26. The compressing and/or heating can be performed using any suitable machine, for example, a lamination press, a hydraulic ram or an autoclave.

When heating is required, the heating may or may not cause reflow of metallurgical paste 20. In the case where metallurgical paste 20 does not reflow, when cores 10, 26 are compressed, metallurgical paste 20 compresses and metallurgical spheres 22 also compress. The compression is sufficient to electrically connect conductive surface 18 to conductive surface 38. Compressed metallurgical spheres 22-form a metallurgical bond before adhesive sheet 30 flows. Conductive surfaces 18, 38 may have a thin layer comprising a precious metal to improve the electrical connection between conductive surfaces 18, 38. Adhesive sheet 30 prevents metallurgical spheres 22 from flowing off conductive surface 18. Excess metallurgical spheres 22 maybe present and flow into vias 12, 34 when cores 10, 26 are compressed.

In the case where the heating of cores 10, 26 causes reflow of metallurgical paste 20, rehardened metallurgical paste 20 forms strong mechanical, intermetallic and electrical connections between conductive surfaces 18, 38. Adhesive sheet 30 acts as a gasket and prevents reflowed metallurgical paste 20 from flowing off conductive surface 18. Excess reflowed metallurgical paste 20 may flow into vias 12, 34 harmlessly coating the inside of vias 12, 34. Conductive surfaces 18, 38 can comprise copper or an equivalent plating that will maintain a good electrical connection.

In a second embodiment of the invention, metallurgical paste electrically connects a pad having a conductive surface on a core to a via having a conductive surface on another core.

Figure 3:
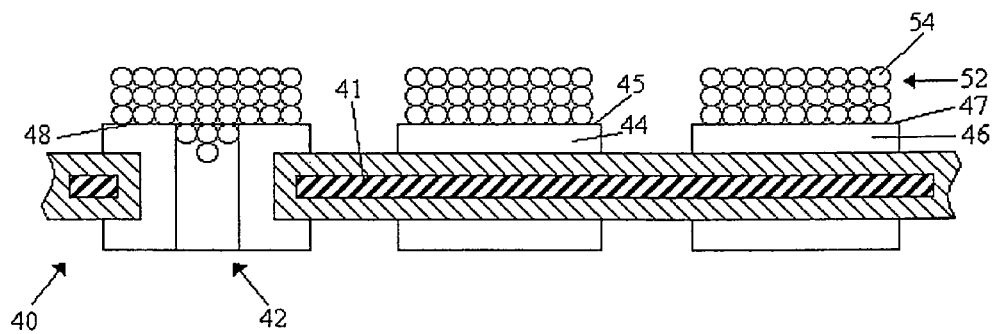
FIG. 3 shows a metallurgical paste screened onto a core having vias with conductive surfaces and pads with conductive surfaces according to one embodiment of the current invention.

Referring now to FIG. 3, a core 40 is shown having a via 42 and pads 44, 46. Core 40 may comprise an epoxy core or any similar structure as commonly known in the art. Core 40 may include one or more planes 41, which may include, for example, a power plane or ground plane. Via 42 and pads 44, 46 have conductive surfaces 48, 45, 47, respectively, formed on a surface of core 40. Conductive surfaces 45, 47, 48 can comprise a thin layer of any solderable conductive material including, for example, a precious metal or copper.

In the first step of the method, a metallurgical paste 52 is applied to conductive surfaces 45, 47, 48 using any standard screening technique or equivalent thereof now known or later developed. Metallurgical paste 52 includes a plurality of metallurgical spheres 54 and flux.

After applying metallurgical paste 52 to conductive surfaces 45, 47, 48, the flux is partially removed from metallurgical paste 52. In one embodiment, core 40 with metallurgical paste 52 is heated, causing some of the flux to evaporate. For example, metallurgical paste 52 may comprise eutectic solder paste, having a melting point of about 183 degrees C. After applying eutectic solder paste to core 40, core 40 may be placed in an oven at 160-170 degrees C. to partially remove the flux. In one embodiment, the temperature of the oven should not cause reflow of metallurgical paste 52. As shown in FIG. 3, a solid cylindrical sphere having numerous metallurgical spheres 54 remains on conductive surfaces 45, 47, 48 after metallurgical paste 52 is dried. Although solid, metallurgical spheres 54 remain more flexible than if allowed to reflow.

Figure 4:
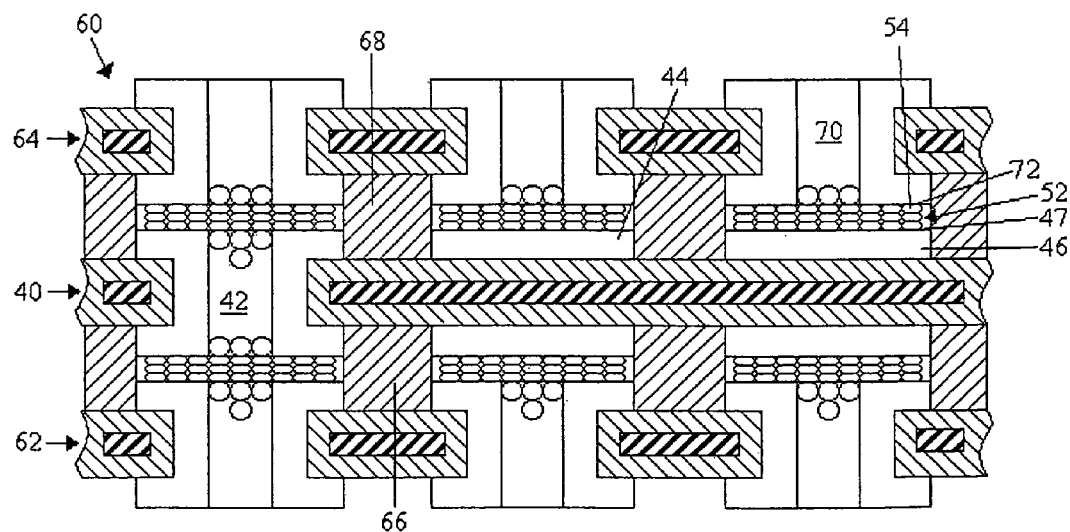
FIG. 4 shows a plurality of cores attached according to one embodiment of the current invention wherein a metallurgical paste makes an electrical connection between two vias or a via and a pad.

Next, a plurality of cores are attached. Referring now to FIG. 4, a lay-up 60 is shown having multiple cores 40, 62, 64 that have been joined. In this embodiment, the structure includes cores 40, 62, 64 attached using adhesive sheets 66, 68. Adhesive sheets 66, 68 are interposed between cores 40, 62, 64 after having been prepared with the necessary opening (s) that substantially conform with, for example, via 42, pads 44, 46, and their corresponding conductive surfaces 48, 45, 47, respectively. Adhesive sheets 66, 68 may be made from a nonconductive material, and are commonly known in the art. The flexibility of the cylindrical sphere of dried metallurgical paste 52 makes alignment of adhesive sheets 66, 68 with the surface features of each core easier.

Using cores 40, 64, via 70 and pad 46 as an example of the general method and structure shown in FIG. 4, adhesive sheet 68 is interposed between cores 40, 64 such that an opening aligns with via 70 and pad 46. Cores 40, 64 are aligned so that via 70 aligns with pad 46 and metallurgical paste 52 on conductive surface 47 aligns and contacts conductive surface 72 of via 70.

Finally, cores 40, 62, 64 are attached. Continuing with the example from above, cores 40, 64 may be joined by compressing core 40 to core 64. Additionally, adhesive sheet 68 may require heating to bond with cores 40, 64. Therefore, cores 40, 64 may be simultaneously compressed and heated to a temperature required to cause adhesive sheet 68 to bond with cores 40, 64. The compressing and/or heating can be performed using any suitable machine, for example, a lamination press, a hydraulic ram or an autoclave.

When heating is required, the heating may or may not cause reflow of metallurgical paste 52. In the case where metallurgical paste 52 does not reflow, when cores 40, 64 are compressed, metallurgical paste 52 compresses and metallurgical spheres 54 also compress. The compression is sufficient to electrically connect conductive surface 47 to conductive surface 72. Compressed metallurgical spheres 54 form a metallurgical bond before adhesive sheet 68 flows. Conductive surfaces 47, 72 may include a thin layer comprising a precious metal to improve the electrical connection between conductive surfaces 47, 72. Adhesive sheet 68 prevents metallurgical spheres 54 from flowing off conductive surface 47. Excess metallurgical spheres 54 may be present and flow into via 70 when cores 40, 64 are compressed.

In the case where the heating of cores 40, 64 causes reflow of metallurgical paste 52, rehardened metallurgical paste 52 forms strong mechanical, intermetallic and electrical connections between conductive surfaces 47, 72. Adhesive sheet 68 acts as a gasket and prevents reflowed metallurgical paste 52 from flowing off conductive surface 47. Excess reflowed metallurgical paste 52 may flow into via 72 harmlessly coating the inside of via 72. Conductive surfaces 47, 72 can comprise copper or an equivalent plating that will maintain a good electrical connection.

While the previous discussion is limited to attaching two cores and the figures show a structure including three cores, it should be recognized that any number of cores can be simultaneously attached under the invention. A structure may include, for example, 5 or 7 cores with vias and pads electrically connected with reflowed or non-reflowed metallurgical paste.

Solder paste, or sintered solder, is only exemplary of the material that can be used in the invention to form the electrical connection. Various types of metallurgical paste can be used. High temperature pastes can be used when reflow is not desired, including, for example, tin/lead mixtures. The tin/lead mixtures may have tin/lead concentrations of 97/3, 90/10, or 63/37, for example. Lead free solders may also be used, including: tin/bismuth (relative concentrations of 42/58, for example), tin/gold/copper (relative concentrations of 93.6/4.7/1.7, for example), tin/antimony (relative concentrations of 95/5, for example), tin/gold/copper/antimony (relative concentrations of 96.2/2.5/0.8/0.5, for example) and tin/lead/gold (relative concentrations of 5/92.5/2.5, for example). Other materials include, for example: copper spheres plated with tin, tin/lead or a mixture of tin and gold, etc.; other metallic and electrically conductive materials used with mechanical binders to connect the spherical particles; a high temperature metallic alloy; a low temperature solder paste; a solder paste alloyed with palladium or any other precious metal; etc.

In addition to providing an electrical connection between two conductive surfaces, the metallurgical paste also provides a mechanical bond between the two cores. When the metallurgical paste is allowed to reflow and harden, the metallurgical paste also provides an intermetallic bond between the cores. Consequently, the metallurgical paste strengthens the attachment of the cores.

When used in the discussion above, the thin layer of precious metal is about 5 to about 50 microinches thick (one microinch is one millionth of an inch, 0.000001 inch). A typical thickness is about 25 microinches. In addition, a layer of nickle about 100-200 microinches thick can be included to prevent copper migration and act as a barrier between the layer of precious metal.

The cores, vias and metallurgical spheres shown in the figures are not shown to scale. The cores can be any size including, for example, a P3Z panel or chip carrier. The metallurgical paste can contain spheres of appropriate size as determined by the size of the vias. For example, solder paste containing spheres less than 15 microns (type 6) can be used on the P3Z chip carrier vias.

While the figures show cores, or epoxy cores, with vias as examples, it should be understood that the present invention is not merely limited to cores with vias. For example, the teachings of the present invention apply equally to attaching a core with a via to numerous other items with conductive surfaces including for example; a core with no vias or a circuit board. Additionally, a core may contain micro-vias for a chip carrier.

The foregoing description of the embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. A structure comprising:
   a plurality of cores attached with an adhesive;
   wherein at least one core has a via having an opening and a first conductive surface adjacent thereto; and
   wherein a dried metallurgical paste forms an electrical connection between the first conductive surface and a second conductive surface of another core in an area proximate to the opening.

2. The structure of claim 1, wherein at least one core comprises one of the group consisting of: a circuit board and a chip carrier.

3. The structure of claim 1, wherein the second conductive surface comprises a conductive surface of a via in the another core.

4. The structure of claim 1, wherein the second conductive surface comprises a conductive surface of a pad on the another core.

5. The structure of claim 1, wherein the adhesive comprises an adhesive sheet comprising an opening that substantially conforms with the first conductive surface.

6. The structure of claim 1, wherein the adhesive comprises a nonconductive material.

7. The structure of claim 1, wherein the metallurgical paste comprises a plurality of compressed metallurgical spheres.

8. A structure comprising:
   a first core comprising a via, wherein the via includes a first conductive surface;
   a second core comprising a second conductive surface;
   an adhesive sheet disposed between the first and second cores, wherein the adhesive sheet comprises an opening that substantially conforms to the first conductive surface, and wherein the adhesive sheet is adjacent to the first conductive surface and the second conductive surface; and
   a non-reflowed metallurgical paste disposed between the first and second conductive surfaces, wherein the metallurgical paste forms an electrical connection between the first and second conductive surfaces.

9. The structure of claim 8, wherein the adhesive sheet comprises a nonconductive material.

10. The structure of claim 8, wherein the metallurgical paste comprises a plurality of compressed metallurgical spheres.

11. A structure comprising:
    a first core comprising a via, wherein the via includes an opening and a first conductive surface adjacent thereto;

a second core comprising a second conductive surface, wherein at least one of the first and second conductive surfaces comprises at least a thin layer of precious metal;

an nonconductive adhesive disposed between the first and second cores; and a dried metallurgical paste disposed between the first and second conductive surfaces, wherein the metallurgical paste forms an electrical connection between the first and second conductive surfaces in an area proximate to the opening.

12. The structure of claim 11, wherein the metallurgical paste comprises a plurality of compressed metallurgical spheres.

13. The structure of claim 11, wherein the nonconductive adhesive comprises an adhesive sheet having an opening that substantially conforms to the first conductive surface.

14. The structure of claim 1, wherein the first and second conductive surfaces comprise copper.

15. The structure of claim 1, wherein the metallurgical paste comprises a plurality of solder spheres.

16. The structure of claim 1, wherein the metallurgical paste comprises eutectic solder paste.

17. The structure of claim 1, wherein at least one of the first and second conductive surfaces comprises at least a thin layer of precious metal.

18. The structure of claim 8, wherein at least one of the first and second conductive surfaces comprises at least a thin layer of precious metal.

19. The structure of claim 8, wherein the metallurgical paste comprises eutectic solder paste.

20. The structure of claim 11, wherein the metallurgical paste comprises eutectic solder paste.

* * * * *